United States Patent [19]

Seyama et al.

[11] Patent Number: 5,586,006

[45] Date of Patent: Dec. 17, 1996

[54] MULTI-CHIP MODULE HAVING A MULTI-LAYER CIRCUIT BOARD WITH INSULATING LAYERS AND WIRING CONDUCTORS STACKED TOGETHER

[75] Inventors: Kiyotaka Seyama; Shunichi Kikuchi; Makoto Sumiyoshi; Naoki Yasuda; Minoru Hirano; Hitoshi Nori, all of Kawasaki, Japan

[73] Assignee: Fujitsu Limited, Kawasaki, Japan

[21] Appl. No.: 573,577

[22] Filed: Dec. 15, 1995

Related U.S. Application Data

[63] Continuation of Ser. No. 234,880, Apr. 28, 1994, abandoned.

[30] Foreign Application Priority Data

Aug. 12, 1993 [JP] Japan ..................... 5-200736

[51] Int. Cl.⁶ ..................................... H05K 7/20
[52] U.S. Cl. .................... 361/719; 174/255; 361/789; 361/792
[58] Field of Search ................ 439/65, 67–72, 439/74, 75, 77; 174/250, 252, 255–256, 260; 428/210, 901; 257/672, 701, 703, 712, 778, 780, 787; 361/690, 701–704, 708, 718, 719, 749, 760, 767, 768, 772, 773, 777, 778, 784, 789, 790, 792

[56] References Cited

U.S. PATENT DOCUMENTS

| | | | |
|---|---|---|---|
| 4,389,862 | 6/1983 | Hastings | 70/2 |
| 4,982,311 | 1/1991 | Dehaine | 361/388 |
| 5,045,922 | 9/1991 | Kodama | 357/75 |
| 5,130,768 | 7/1992 | Wu | 357/82 |
| 5,155,661 | 10/1992 | Nagesh | 361/386 |
| 5,256,469 | 10/1993 | Cherukuri | 428/210 |
| 5,258,649 | 11/1993 | Tanaka | 257/787 |
| 5,306,670 | 4/1994 | Mowatt | 437/209 |
| 5,432,679 | 7/1995 | Grabbe | 361/769 |
| 5,483,101 | 1/1996 | Shimoto | 257/701 |

FOREIGN PATENT DOCUMENTS

| | | |
|---|---|---|
| 0098932 | 1/1984 | European Pat. Off. . |
| 0475223 | 3/1992 | European Pat. Off. . |
| 0509825 | 10/1992 | European Pat. Off. . |
| 0540247 | 5/1993 | European Pat. Off. . |
| 2557755 | 5/1985 | France . |

OTHER PUBLICATIONS

IEEE Transactions on Components, Hybrids, and Manufacturing Technology, vol. 12, No. 4, Dec. 1989, New York US, pp. 658–662; S. Sasaki et al. 'A New Multichip Module Using a Copper Polyimide Multilayer Substrate'.

Research Disclosure, No. 326, Jun. 1991, Havant GB p. 401, 'Low Profile Chip Package'.

1992 IEEE Multi–Chip Module Conference, MCMC–92, Mar. 18–20, 1992, Santa Cruz, California, USA, pp. 8–11, T. Sudo.: "Silicon–On–Silicon Technology for CMOS–Based Computer Systems", figure 4.

Primary Examiner—Gerald P. Tolin
Attorney, Agent, or Firm—Armstrong, Westerman, Hattori, McLeland & Naughton

[57] ABSTRACT

A multi-chip module includes a base board, a thin-film multi-layer circuit board which is provided on a first surface of the base board and has a multi-layer structure in which insulating layers and wiring conductors are stacked, circuit elements mounted on a main surface of the thin-film multi-layer circuit board, and terminals which are attached to the main surface of the thin-film multi-layer circuit board and electrically connect the wiring conductors to circuits formed on a wiring board on which the multi-chip module is mounted.

32 Claims, 8 Drawing Sheets

MULTI-CHIP MODULE HAVING A MULTI-LAYER CIRCUIT BOARD WITH INSULATING LAYERS AND WIRING CONDUCTORS STACKED TOGETHER

This application is a continuation of application Ser. No. 08/234,880 filed Apr. 28, 1994, now abandoned.

BACKGROUND OF THE INVENTION

Field of the Invention

The present invention relates to a multi-chip module in which a plurality of circuit elements such as LSI chips are mounted on a high-density wiring board (also referred to as a circuit board).

Recently, multi-chip modules have become attractive in which a plurality of LSI chips are mounted on a high-density wiring board in order to speed up the operation and reduce the production cost. As is well known, multi-chip modules are classified into three types, namely a MCM-L, MCM-C and MCM-D. The multi-chip modules of the MCM-L type have a printed wiring board on which circuit elements are mounted, and enable reduction in the production cost. The multi-chip modules of the MCM-C type have a thin-film multi-layer ceramic board on which circuit elements are mounted, and enable reduction in the production cost and speeding up the operation to some extent. The multi-chip modules of the MCM-D type have a thick-film board made of ceramic or the like, on which a circuit board having at least one multi-layer structure in which an insulating layer and at least one wiring conductor layer are alternately stacked. Circuit elements are mounted on the above circuit board. As compared to the other two types, the MCM-D type multi-chip modules operate at high speeds and enable mounting of circuit elements with a high density.

FIG. 1 is a side view of a conventional MCM-D type multi-chip module, which includes a thick-film ceramic board 10 having a multi-layer structure. LSI chips 14 and passive elements 16 such as resistors and capacitors are mounted on a first surface of the thick-film ceramic board 10. These circuit elements 14 and 16 are connected to wiring lines formed inside the thick-film ceramic board 10. A large number of I/O pins 12 are attached to a second surface of the ceramic board 10 opposite to the first surface thereof. The multi-chip module is directly mounted on a printed wiring board 18 by inserting the I/O pins 12 into holes formed in the printed wiring board 18.

FIG. 2 is a side view of a conventional MCM-D type multi-chip module. In FIG. 2, parts that are the same as those shown in FIG. 1 are given the same reference numbers as previously. In order to speed up the operation and increase the density, a thin-film circuit board 20 is provided on the first surface of the thick-film ceramic board 10. The circuit elements 14 and 16 are mounted on the thin-film circuit board 20, and are connected to the thick-film ceramic board 10 and the I/O pins 12 via wiring lines of the thin-film circuit board 20. On the opposite surfaces of the boards 10 and 20, are provided pads (illustration thereof is omitted) for connections, whereby the wiring lines of the boards 10 and 20 are electrically connected together. The multi-chip module shown in FIG. 2 is directly mounted on the printed wiring board 18 by means of the I/O pins 12 in the same manner as the multi-chip module shown in FIG. 1.

FIG. 3 is a side view of a conventional MCM-D type multi-chip module. In FIG. 3, parts that are the same as those shown in FIG. 2 are given the same reference numbers as previously. The thin-film circuit board 20 is mounted on a base board 24 which does not have a wiring conductor layer. The base board 24 is made of ceramic, a silicon wafer or a metallic material such as aluminum. The base board 24 is provided in a base board mounting package 22. The package 22 is made of ceramic or mold resin, and a recess portion in which the base board 24 is accommodated. I/O pins 28 are attached to peripheral portions of the package 22 along the edges thereof. The thin-film circuit board 20 and the I/O pins 28 are connected by wires 26. Pads (not shown) for bonding the wires 26 are provided on the package 22. The multi-chip module shown in FIG. 3 is mounted on the printed wiring board 18 by means of the I/O pins 28. In the structure shown in FIG. 3, the circuit elements 14 and 16 face the printed wiring board 18.

However, the above-mentioned conventional multi-chip modules shown in FIGS. 1 through 3 have the following disadvantages.

The thick-film ceramic board 10 used in the multi-chip module shown in FIG. 1 has a wiring conductor formation density lower than that of the thin-film circuit board 20 shown in FIG. 2. Hence, a large number of stacked layers is needed to form wiring lines which realize a desired circuit configuration. Further, the larger the number of stacked layers, the longer the wiring lines. This delays transmission of signals. Hence, the structure shown in FIG. 1 is not suitable for circuit configurations particularly needed to operate at high speeds.

The multi-chip module shown in FIG. 2 utilizes the thick-film ceramic board 10 and the thin-film circuit board 10, and hence has a high production cost. The process of forming the thin-film circuit board 20 greatly depends on the surface condition (warp, roughness, pore and so on) of the ceramic part of the thick-film ceramic board 10 as well as the wiring lines (pad parts) exposed from the ceramic part. Hence, a defect will occur in the thin-film circuit board 20 and a high yield cannot be obtained if the thick-film ceramic board 10 does not have a good surface condition.

The multi-chip module shown in FIG. 3 is advantageous due to use of the base board 24 made of bulk ceramic, silicon wafer or a metallic material such as aluminum because the base board 24 can be less expensive and has a good surface condition. However, the multi-chip module shown in FIG. 3 needs the package 22 necessary to mount the multi-chip module on the printed wiring board. The use of the package 22 increases the production cost. Further, if the package 22 does not have good electrical characteristics, signals output from the multi-chip module will be delayed or contain a noise component. These phenomena degrade the performance of the multi-chip module. If there is a demand for an increased number of I/O pins 28 and/or an increased number of circuit elements mounted to the base board 24 due to a modification of the circuit configuration or the like, the package 22 needs to be redesigned. This leads to an increase in the production cost and the time necessary for redesign and reproduction.

Further, the structures shown in FIGS. 1 through 3 have a common disadvantage in that the thick-film ceramic board 10 and the base board mounting package 22 need to be redesigned each time the shape of the multi-chip module is modified. This increases the turnaround time of the multi-chip module design and production as well as the production cost.

SUMMARY OF THE INVENTION

It is a general object of the present invention to provide a multi-chip module in which the above disadvantages are eliminated.

A more specific object of the present invention is to provide a less-expensive, high-density, high-speed multi-chip module having high flexibility in the design and production.

The above objects of the present invention are achieved by a multi-chip module comprising: a base board; a thin-film multi-layer circuit board which is provided on a first surface of the base board and has a multi-layer structure in which insulating layers and wiring conductors are stacked; circuit elements mounted on a main surface of the thin-film multi-layer circuit board; and terminals which are attached to the main surface of the thin-film multi-layer circuit board and electrically connect the wiring conductors to circuits formed on a wiring board on which the multi-chip module is mounted.

According to the present invention, since the terminals for external connections are attached to the thin-film multi-layer circuit board, the base board supporting the thin-film multi-layer circuit board does not need wiring conductors unlike the base board mounting package used in the prior art, whereby less-expensive multi-chip modules having good operation characteristics can be produced. Further, the multi-chip module according to the present invention has a high degree of flexibility in design modifications. That is, the design of the multi-chip module can be modified by changing the thin-film multi-layer structure. Further, a modification of the shape of the multi-chip module can be easily achieved by changing the shape of only the thin-film multi-layer circuit board. Hence, it is possible to greatly reduce the TAT of the design and production of the multi-chip module and the production cost.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
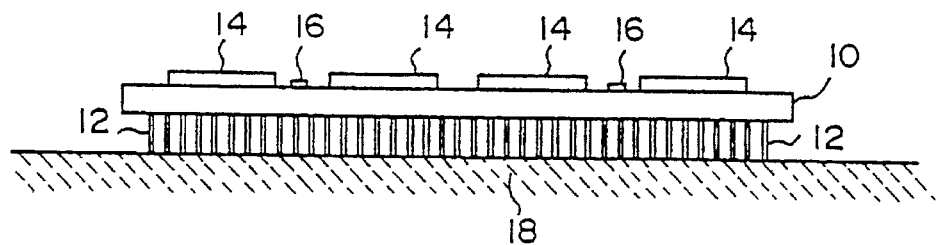
FIG. 1 is a side view of a first conventional multi-chip module.
Figure 2:
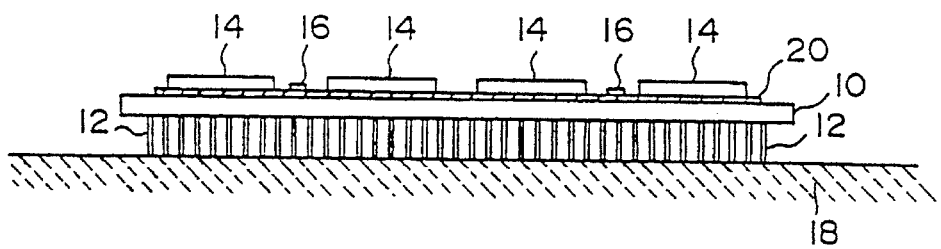
FIG. 2 is a side view of a second conventional multi-chip module.
Figure 3:
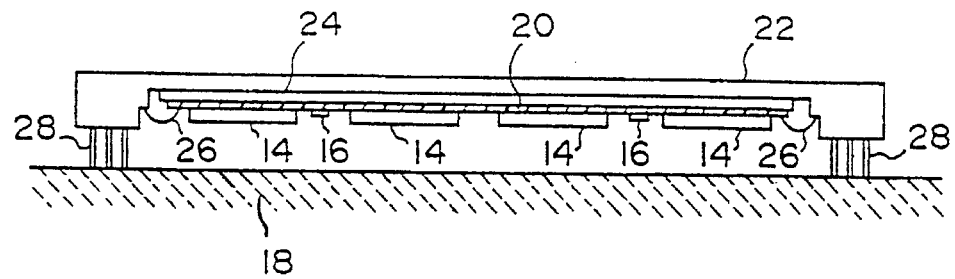
FIG. 3 is a side view of a third conventional multi-chip module.
Figure 4:
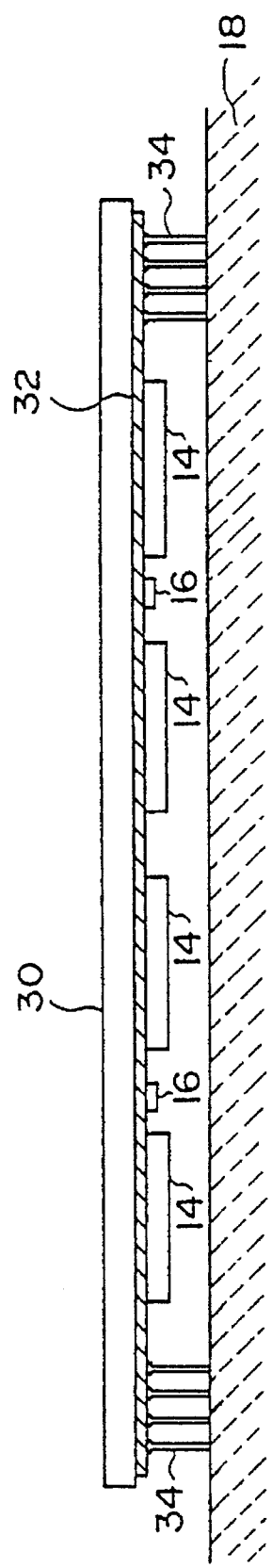
FIG. 4 is a side view of a multi-chip module according to a first embodiment of the present invention.
Figure 5:
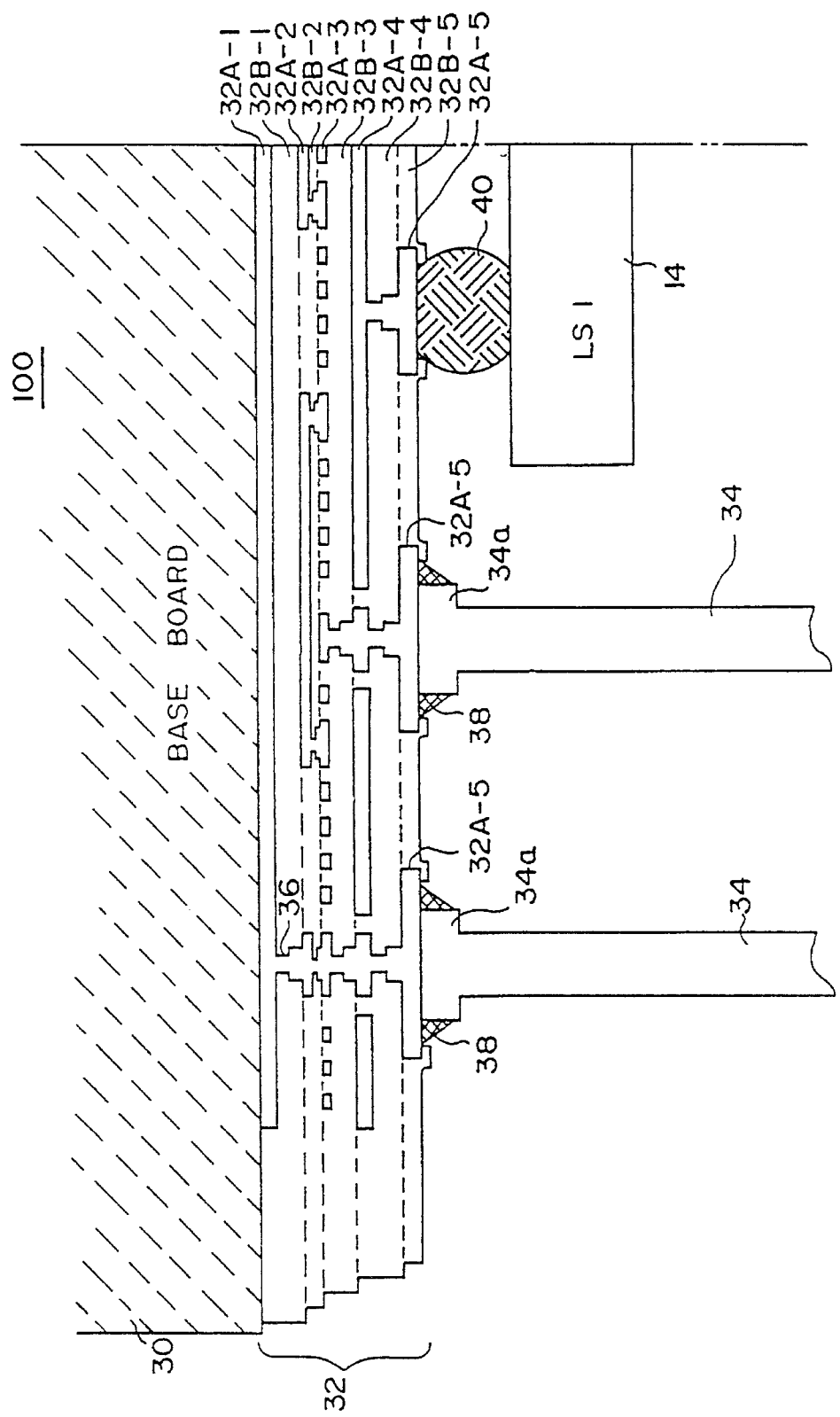
FIG. 5 is a cross-sectional view of an essential part of the multi-chip module shown in FIG. 4.

A description will now be given, with reference to FIGS. 4 and 5, of a multi-chip module 100 according to a first embodiment of the present invention. FIG. 4 is a side view of the multi-chip module 100, and FIG. 5 is a cross-sectional view of an essential part of the multi-chip module 100 shown in FIG. 4. The multi-chip module 100 shown in FIGS. 4 and 5 is of a PGA (Pin Grid Array) type, and includes a base board 30 and a thin-film multi-layer circuit board 32, which is provided on a surface of the base board 30 facing the printed wiring board 18.

As shown in FIG. 5, the thin-film multi-layer circuit board 32 has a multi-layer structure, which is made up of a first wiring conductor 32A-1, a second wiring conductor 32A-2, a third wiring conductor 32A-3, a fourth wiring conductor 32A-4, a fifth wiring conductor 32A-5, a first insulating layer 32B-1, a second insulating layer 32B-2, a third insulating layer 32B-3, a fourth insulating layer 32B-4 and a fifth insulating layer 32B-5. These conductors and insulating layers are serially stacked on the base board 30 in the order shown in FIG. 5. The first wiring conductor 32A-1 is provided on the base board 30.

The fifth wiring conductor 32A-5 functions as pads used to attach I/O pins 34 and LSI chips 14 thereto. The pads 32A-5 to which the I/O pins 34 are attached are arranged in an array. The wiring conductors 32A-1 through 32A-4 extend in the longitudinal and lateral directions (X and Y directions) in the thin-film multi-layer board 32. The wiring conductors located at the different layer levels are electrically connected together by means of a conductor formed in a via hole formed in the insulating layer sandwiched between those wiring conductors. For example, the wiring conductor 32A-1 is connected to the wiring conductor 32A-2 via a via hole 36 formed in the insulating layer 32B-1. The wiring conductor 32A-1 is, for example, a power supply layer.

The thin-film multi-layer circuit board 32 having the above-mentioned multi-layer structure can be produced by a conventional LSI production process.

The attachment surface of the pads 32A-5 is exposed from the insulating layer 32B-5. The I/O pins 34 are attached to the pads 32A-5 by solder 38. The areas of the pads 32A-5 exposed from the insulating layer 32B-5 are greater than those of attachment parts 34a of the I/O pins 34. In the structure shown in FIG. 5, the wiring conductor 32A-1 serving as the power supply layer is connected, via a via hole, to the I/O pin 34 located on the left side of the drawing. The first embodiment of the present invention has an essential feature such that the I/O pins 34 inserted into the printed wiring board 18 are attached to the thin-film multi-layer wiring board 32. Soldering of the I/O pins 34 can be performed in a conventional manner.

The LSI chip 14 shown in FIG. 5 is attached to the pad 32A-5 by means of a solder bump 40. Instead of the solder bump 40, a wire bonding or a TAB (Tape Automated Bonding) lead can be used.

A description will now be given of the materials of the parts of the multi-chip module shown in FIGS. 4 and 5. The base board 30 is made of a ceramic such as AlN, Al$_2$O$_3$ or Mulite, a metallic material such as Al, Cu, a Cu-W alloy or the like, Si or glass. The base board 30 may be formed of resin used as an insulating material for conventional printed wiring boards, such as glass epoxy or glass polyimide.

The insulating layers 32B-1 through 32B-5 of the thin-film multi-layer circuit board 32 are made of an organic material such as polyimide, Teflon (trademark), or epoxy. The wiring conductors 32A-1 through 32A-5 are made of Al, Cu or the like.

The thin-film multi-layer circuit board 32 is not limited to the structure shown in FIG. 5, but can be a stacked structure in which arbitrary numbers of wiring conductors and insulating layers are alternately stacked.

Figure 6:
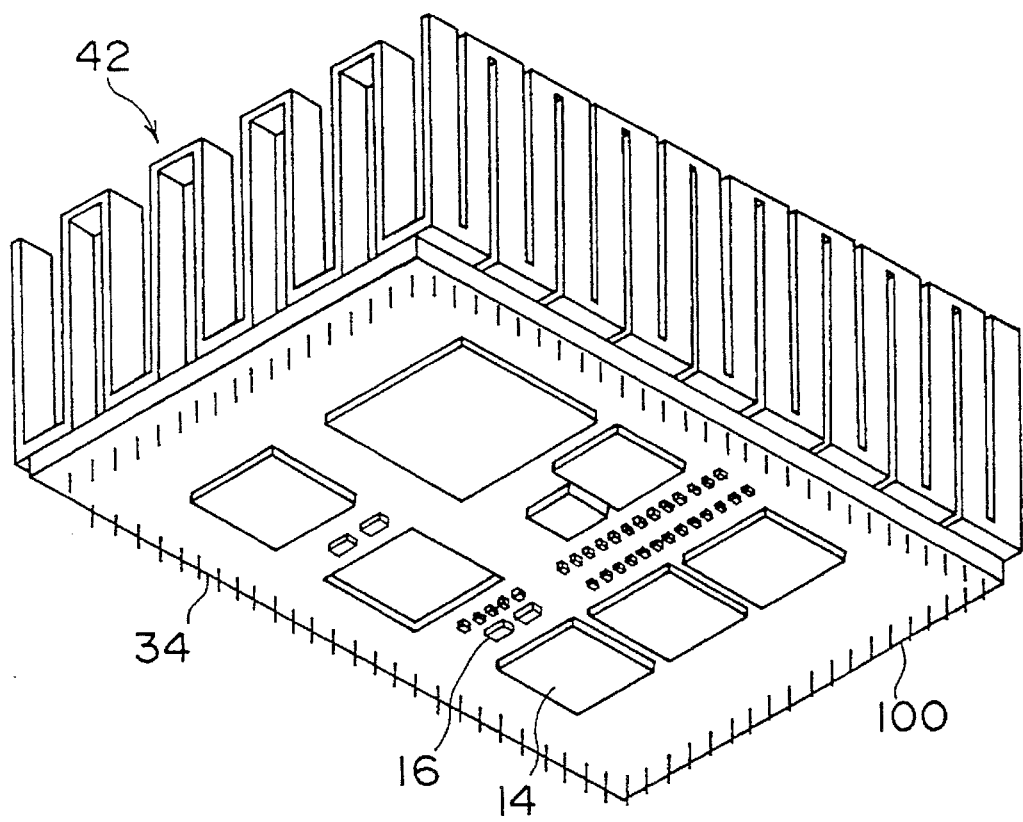
FIG. 6 is a perspective view of the multi-chip module shown in FIG. 4 viewed from the bottom thereof.

FIG. 6 is a perspective view of the multi-chip module 100. The I/O pins 34 are arranged in the peripheral areas of the thin-film multi-layer circuit board 32 so as to surround the LSI chips 14 and the passive elements 16 such as resistors and capacitors. For the sake of simplicity, the illustration of the I/O pins 34 is simplified. On the surface of the base board 30 opposite to the surface having the thin-film multi-layer circuit board 32 is provided a fin-type heat sink 42 for cooling the multi-chip module 100. The heat sink 42 may have a pipe (not shown) in which coolant water flows.

Figure 7:
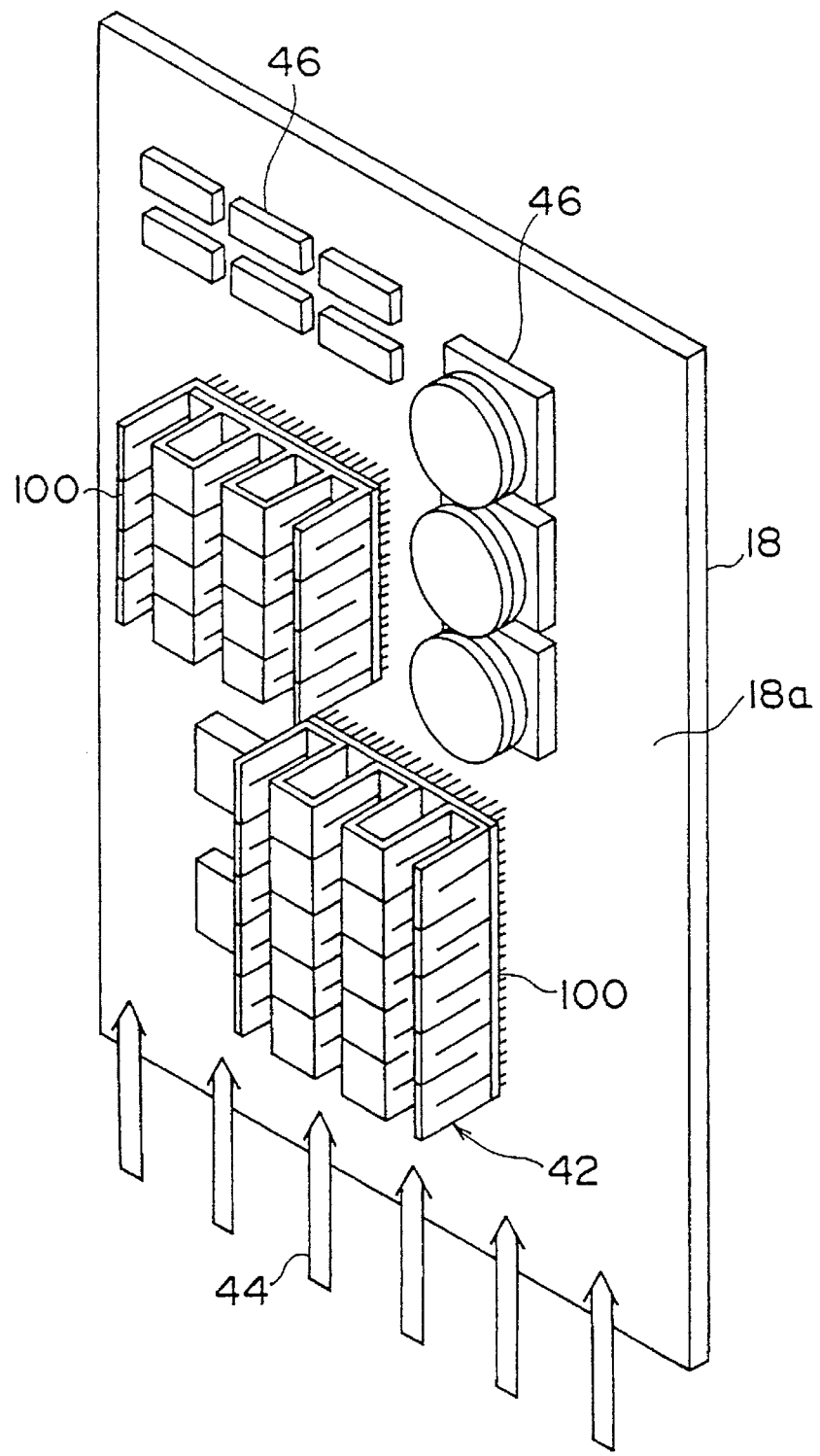
FIG. 7 is a perspective view of multi-chip modules according to the first embodiment of the present invention on a printed wiring board.

FIG. 7 is a perspective view of multi-chip modules 100 which are mounted on the printed wiring board 18. The multi-chip modules 100 are mounted on a mounting surface of the printed wiring board 18 together with semiconductor elements 46. A cooling air stream 44 is present, as indicated by the arrows shown in FIG. 7.

Figure 8:
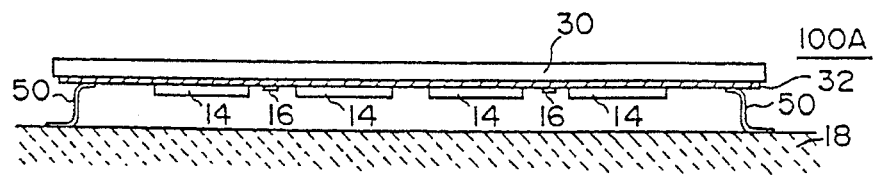
FIG. 8 is a side view of a multi-chip module according to a second embodiment of the present invention.

FIG. 8 is a side view of a multi-chip module 100A according to a second embodiment of the present invention. In FIG. 8, parts that are the same as those shown in the previously described figures are given the same reference numbers as previously. The multi-chip module 100A shown in FIG. 8 is of a FLT (flat) package type. I/O pins 50 are formed with gull-wing type leads, and are soldered to the pads 32A-5 shown in FIG. 5. The multi-chip module 100A shown in FIG. 8 has the same advantages as the first embodiment of the present invention. However, the number of attachable I/O pins 50 is less than that of I/O pins 34 of the PGA type. A cooling structure can be applied to the multi-chip module 100A in the same manner as that used in the first embodiment of the present invention. The I/O pins 50 may be TAB leads.

Figure 9:
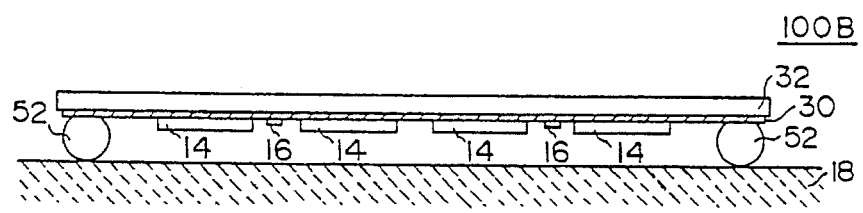
FIG. 9 is a side view of a multi-chip module according to a third embodiment of the present invention.

FIG. 9 is a side view of a multi-chip module 100B according to a third embodiment of the present invention. In FIG. 9, parts that are the same as those shown in the previously described figures are given the same reference numbers as previously. The multi-chip module shown in FIG. 9 is of a leadless type such as a BGA (Ball Grid Array) or a LGA (Land Grid Array). Solder bumps 52 are attached to the pads 32A-5 shown in FIG. 5. For the sake of simplicity, two bumps 52 are respectively shown on the left and right side of the figure. However, bumps 52 can be arranged in an array as in the case of the PGA type. The multi-chip module 100B shown in FIG. 9 has the same advantages as the first embodiment of the present invention. In the LGA type, flat pads are used instead of the bumps 52. A cooling structure can be employed in the same manner as that used in the first embodiment of the present invention.

Figure 10:
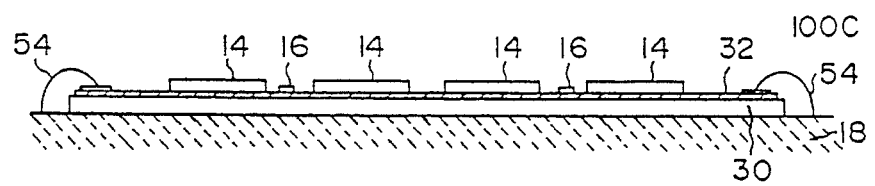
FIG. 10 is a side view of a multi-chip module according to a fourth embodiment of the present invention.

FIG. 10 is a side view of a multi-chip module 100C according to a fourth embodiment of the present invention. In FIG. 10, parts that are the same as those shown in the previously described figures are given the same reference numbers as previously. The multi-chip module 100C shown in FIG. 10 is of a wire bonding type. Wires 54 are bonded to the pads 32A-5 shown in FIG. 5. The multi-chip module 100C is directly placed on and in contact with the printed wiring board 18. This mounting is different from the mounting according to the first through third embodiments of the present invention. The fourth embodiment of the present invention cannot employ a cooling structure similar to that used in the first through third embodiments of the present invention. The multi-chip module 100C is cooled via the printed wiring board 18.

The I/O terminals of the present invention are not limited to the above-mentioned types, and other types of I/O terminals can be used.

Figure 11:
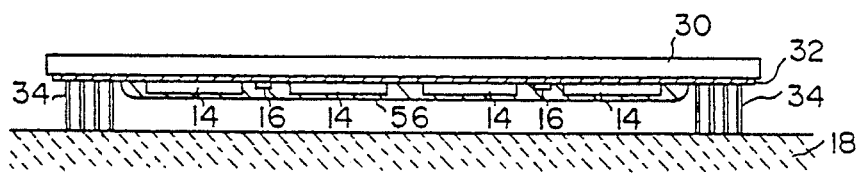
FIG. 11 is a side view of the multi-chip module shown in FIG. 4 with a cover made of resin.

FIG. 11 is a side view of the multi-chip module 100 to which a cover 56 made of resin is attached. The cover 56 is provided so that it seals the LSI chips 14 and the circuit elements 16. The resin cover 56 is made of, for example, epoxy-based resin or a silicon-based resin (potting). The resin cover 56 can be provided so that it seals only some of the LSI chips 14 and the circuit elements 16. The cover 56 can be applied to the second through fourth embodiments of the present invention in the same manner as described above.

Figure 12:
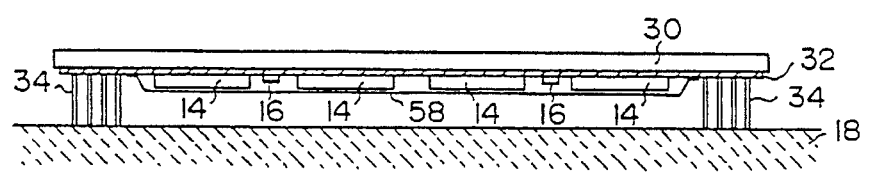
FIG. 12 is a side view of the multi-chip module shown in FIG. 4 with a cover formed with a lid.
Figure 13:
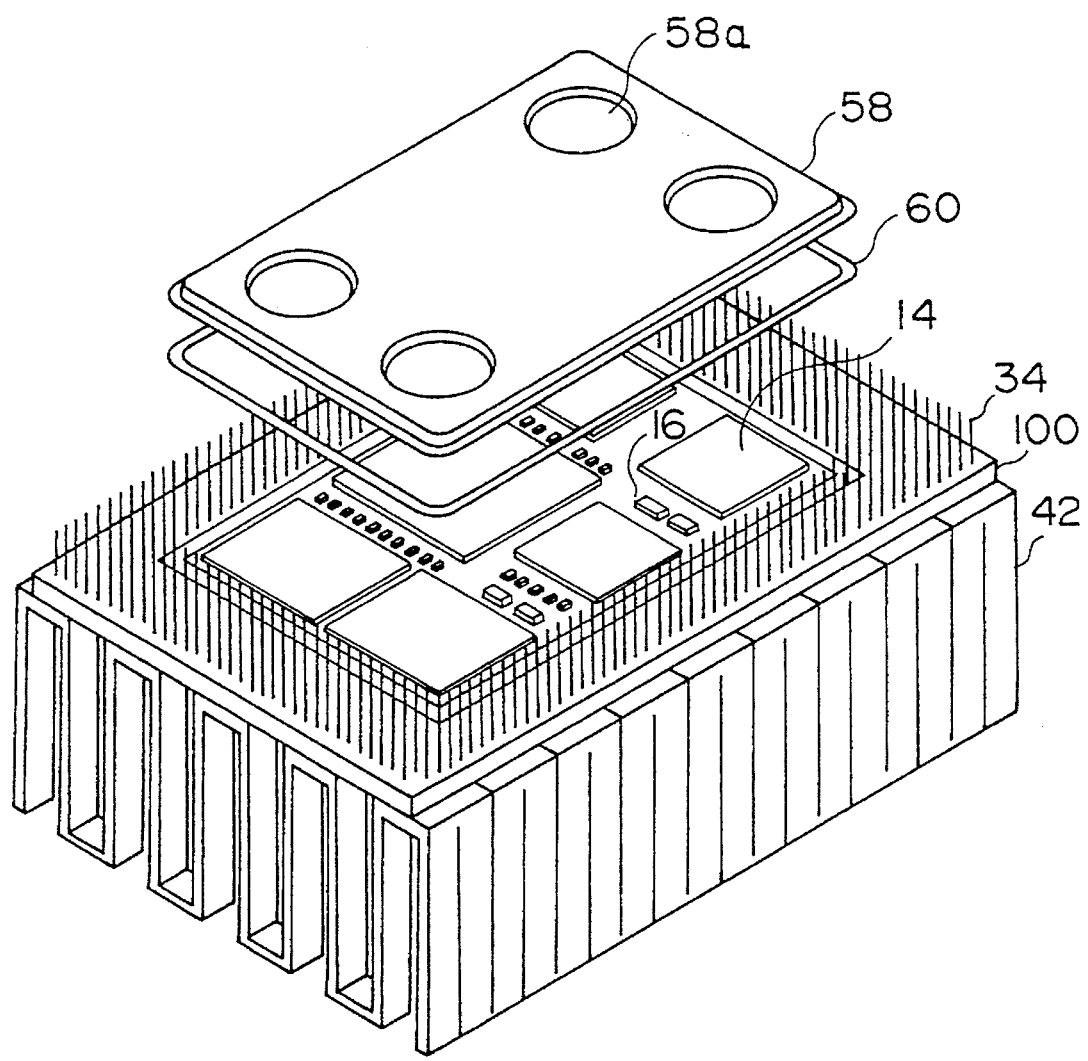
FIG. 13 is an exploded perspective view of the multi-chip module shown in FIG. 12 with a cooling structure.
Figure 14:
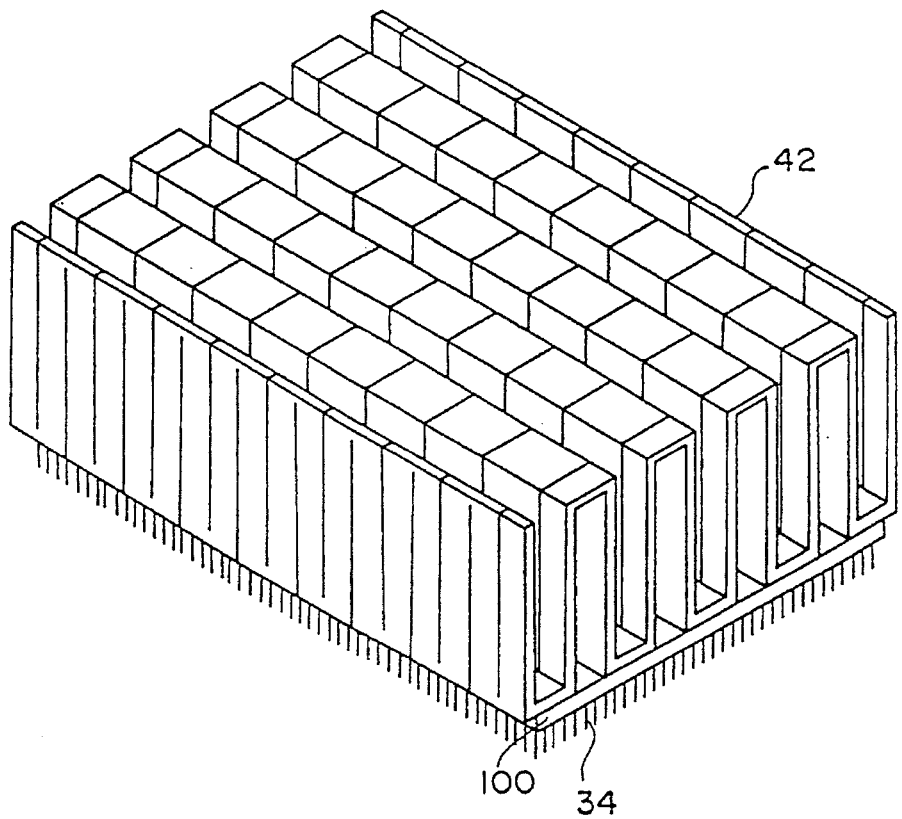
FIG. 14 is a perspective view of the multi-chip module shown in FIG. 12 with a cooling structure attached thereto.

FIG. 12 is a side view of the multi-chip module 100 to which a lid 58 is attached. FIGS. 13 and 14 are perspective views of the structure shown in FIG. 12 with the heat sink 42 shown in FIG. 6. The lid 58 is attached to the thin-film multi-layer circuit board 32 via a ring-shaped seal member 60 (FIG. 13). In the structure shown in FIGS. 12 and 13, the lid 58 seals all the LSI chips 14 and other circuit elements 16. As shown in FIG. 13, recesses 58a are formed in the lid 58 to reinforce the lid 58 itself. A heat conducting member may be provided between the recesses 58a and the LSI chips 14 in order to radiate heat generated by the LSI chips 14. It is possible to use a lid which seals only some LSI chips 14 and circuit elements 16. The lid 58 is made of, for example, a metallic material such as aluminum or covar or a resin.

Figure 15:
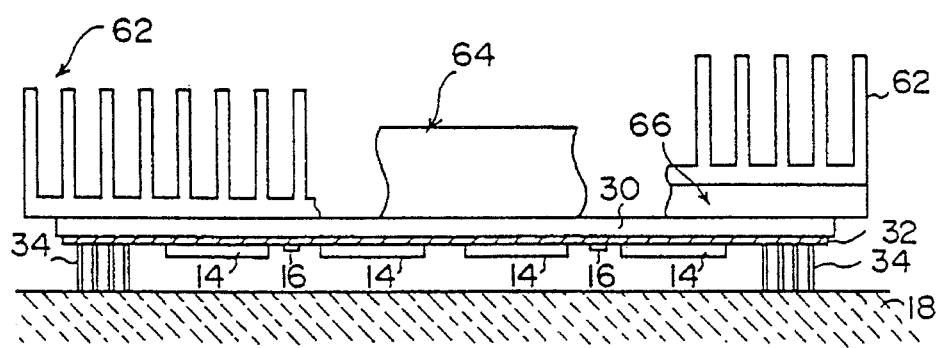
FIG. 15 is a side view showing cooling structures that can be applied to the present invention multi-chip module.

The cooling structures which can be applied to the multi-chip module of the present invention are not limited to the aforementioned heat sink 42, but other appropriate cooling structures can be attached to the base board 30. For example, as shown in FIG. 15, it is possible to use a fin-type heat sink (of an air cooling type or a water cooling type) 62, a cold plate (of a water cooling type) 64 or a built-in Peltier-effect plate 66 alone or any combinations thereof. If the strength of the base board 30 becomes weak because of attachment of the cooling structure, a conventional supporting member may be used to mount the multi-chip module on the printed wiring board 18.

According to the present invention, since the I/O terminals for external connections are attached to the thin-film multi-layer circuit board, the base board supporting the thin-film multi-layer circuit board does not need wiring conductors unlike the base board mounting package used in the prior art, whereby less-expensive multi-chip modules having good operation characteristics can be produced. Further, the multi-chip module according to the present invention has a high degree of flexibility in design modifications. That is, the design of the multi-chip module can be modified by changing the thin-film multi-layer structure. Further, a modification of the shape of the multi-chip module can be easily achieved by changing the shape of only the thin-film multi-layer circuit board. Hence, it is possible to greatly reduce the TAT of the design and production of the multi-chip module and the production cost.

The present invention is not limited to the specifically disclosed embodiments, and variations and modifications may be made without departing from the scope of the present invention.

What is claimed is:

1. A multi-chip module, comprising:

a base board;

a thin-film multi-layer circuit board which is provided on a first surface of the base board and has a multi-layer structure in which insulating layers and wiring conductors are stacked, wherein said thin-film multi-layer circuit board includes at least one of said wiring conductors which extends to a main external surface thereof;

circuit elements mounted on said main external surface of the thin-film multi-layer circuit board; and terminals which are attached to the main surface of the thin-film multi-layer circuit board and electrically connect the wiring conductors to circuits formed on a wiring board on which the multi-chip module is mounted, wherein the terminals are attached and supported between said at least one of said wiring conductors of the thin-film multi-layer circuit board and said circuits on said wiring board, wherein said wiring conductors are located at different layer levels, and have longitudinally extending portions and laterally extending portions, and wherein said wiring conductors are electrically connected to each other by way of said longitudinally extending portions passing through via holes formed in the insulating layers.

2. The multi-chip module as claimed in claim 1, wherein said terminals comprise lead members.

3. The multi-chip module as claimed in claim 1, wherein said terminals comprise leadless members.

4. The multi-chip module as claimed in claim 1, wherein said terminals are soldered to wiring conductors of the thin-film multi-layer circuit board facing the wiring board, so that the terminals are supported by the thin-film multi-layer circuit board.

5. The multi-chip module as claimed in claim 2, wherein said terminals are soldered to wiring conductors of the thin-film multi-layer circuit board facing the wiring board, so that the terminals are supported by the thin-film multi-layer circuit board.

6. The multi-chip module as claimed in claim 3, wherein said terminals are soldered to wiring conductors of the thin-film multi-layer circuit board facing the wiring board.

7. The multi-chip module as claimed in claim 1, wherein wiring conductors of the thin-film multi-layer circuit board facing the wiring board comprise pad areas to which said terminals are connected.

8. The multi-chip module as claimed in claim 2, wherein wiring conductors of the thin-film multi-layer circuit board facing the wiring board comprise pad areas to which said terminals are connected.

9. The multi-chip module as claimed in claim 3, wherein wiring conductors of the thin-film multi-layer circuit board facing the wiring board comprise pad areas to which said terminals are connected.

10. The multi-chip module as claimed in claim 4, wherein wiring conductors of the thin-film multi-layer circuit board facing the wiring board comprise pad areas to which said terminals are connected.

11. The multi-chip module as claimed in claim 2, wherein said lead members comprise lead pins vertically extending from the main surface of the thin-film multi-layer circuit board.

12. The multi-chip module as claimed in claim 2, wherein said lead members comprise flat-type lead pins.

13. The multi-chip module as claimed in claim 2, wherein said lead members comprise wire leads.

14. The multi-chip module as claimed in claim 2, wherein said lead members comprise tape-automated bonding leads.

15. The multi-chip module as claimed in claim 1, wherein said terminals are located in peripheral areas on the main surface of the thin-film multi-layer circuit board so that said terminals surround the circuit elements.

16. The multi-chip module as claimed in claim 2, wherein said terminals are located in peripheral areas on the main surface of the thin-film multi-layer circuit board so that said terminals surround the circuit elements.

17. The multi-chip module as claimed in claim 3, wherein said terminals are located in peripheral areas on the main surface of the thin-film multi-layer circuit board so that said terminals surround the circuit elements.

18. The multi-chip module as claimed in claim 4, wherein said terminals are located in peripheral areas on the main surface of the thin-film multi-layer circuit board so that said terminals surround the circuit elements.

19. The multi-chip module as claimed in claim 7, wherein said terminals are located in peripheral areas on the main surface of the thin-film multi-layer circuit board so that said terminals surround the circuit elements.

20. The multi-chip module as claimed in claim 1, further comprising a cover which is formed on the main surface of the thin-film multi-layer circuit board and covers the circuit elements.

21. The multi-chip module as claimed in claim 2, further comprising a cover which is formed on the main surface of the thin-film multi-layer circuit board and covers the circuit elements.

22. The multi-chip module as claimed in claim 3, further comprising a cover which is formed on the main surface of the thin-film multi-layer circuit board and covers the circuit elements.

23. The multi-chip module as claimed in claim 4, further comprising a cover which is formed on the main surface of the thin-film multi-layer circuit board and covers the circuit elements.

24. The multi-chip module as claimed in claim 7, further comprising a cover which is formed on the main surface of the thin-film multi-layer circuit board and covers the circuit elements.

25. The multi-chip module as claimed in claim 15, further comprising a cover which is formed on the main surface of the thin-film multi-layer circuit board and covers the circuit elements.

26. The multi-chip module as claimed in claim 1, further comprising a cooling structure which is formed on a second surface of the base board opposite to the first surface thereof and which cools the multi-chip module.

27. The multi-chip module as claimed in claim 2, further comprising a cooling structure which is formed on a second surface of the base board opposite to the first surface thereof and which cools the multi-chip module.

28. The multi-chip module as claimed in claim 3, further comprising a cooling structure which is formed on a second surface of the base board opposite to the first surface thereof and which cools the multi-chip module.

29. The multi-chip module as claimed in claim 4, further comprising a cooling structure which is formed on a second surface of the base board opposite to the first surface thereof and which cools the multi-chip module.

30. The multi-chip module as claimed in claim 7, further comprising a cooling structure which is formed on a second surface of the base board opposite to the first surface thereof and which cools the multi-chip module.

31. The multi-chip module as claimed in claim 15, further comprising a cooling structure which is formed on a second surface of the base board opposite to the first surface thereof and which cools the multi-chip module.

32. The multi-chip module as claimed in claim 20, further comprising a cooling structure which is formed on a second surface of the base board opposite to the first surface thereof and which cools the multi-chip module.

* * * * *